United States Patent
Wertz

(10) Patent No.: US 8,021,179 B1
(45) Date of Patent: Sep. 20, 2011

(54) LOADING MECHANISM HAVING PROPORTIONAL DISTRIBUTING ARRANGEMENT

(75) Inventor: Darrell Lynn Wertz, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/931,590

(22) Filed: Feb. 3, 2011

(51) Int. Cl.
*H01R 13/62* (2006.01)
(52) U.S. Cl. ....................................................... 439/331
(58) Field of Classification Search ................... 439/73, 439/331
See application file for complete search history.

(56) References Cited

U.S. PATENT DOCUMENTS

| 7,112,058 | B2 * | 9/2006 | Felix .............................. 425/590 |
| 7,819,693 | B2 | 10/2010 | Polnyi |
| 2004/0140548 | A1 | 7/2004 | Wenjun et al. |
| 2010/0099275 | A1 | 4/2010 | Wahlberg |

* cited by examiner

*Primary Examiner* — Tho D Ta
(74) *Attorney, Agent, or Firm* — Wei Te Chung; Andrew C. Cheng; Ming Chieh Chang

(57) ABSTRACT

A loading mechanism includes a loading plate, a proportional distributing plate disposed under the loading plate and defining a frame structure. The proportional distributing plate includes engaging tabs at corners thereof and four sides each having an abutting section located at a lower level than the engaging tab. The loading plate depresses the tabs of the distributing plate which subsequently transfer the load applied on the tabs to the abutting sections of the sides.

19 Claims, 5 Drawing Sheets

US 8,021,179 B1

LOADING MECHANISM HAVING PROPORTIONAL DISTRIBUTING ARRANGEMENT

BACKGROUND OF THE INVENTION

1. Field of the Invention

The present invention relates to a loading mechanism, and more particularly to a loading mechanism having proportional distributing arrangement effectively and robustly applying retaining and engaging force to both a heat sink and an IC package.

2. Description of Related Art

U.S. Pat. No. 7,387,523 issued to Hsiu-Yuan, Hsu, on Jun. 17, 2008 discloses a socket assembly which includes a housing assembly for receiving an IC package and a load plate pivotably assembled to the housing assembly for loading the IC package. A retention plate is provided to position the IC package in a predetermined position upon the housing assembly before the close of the loading plate. The loading plate has two opposite edges each having an abutting section capable of pressing the retention plate when the loading plate is closed, such that the IC package is securely retained upon the housing assembly. However, one disadvantage of Hsu is that the loading plate is provided with only two contacting points to engage the IC package and thus fails to place the IC package in a balanced position. In addition, an external heat sink is usually required to be located above the load plate and directly touch the IC package so as to facilitate dissipation of the heat the IC package generated. However, the heat sink needs to be secured to a mother board by auxiliary fasteners, which simultaneously occupies a large space.

In view of the above, an improved socket assembly is desired which has a loading mechanism providing even load to an IC package.

SUMMARY OF THE INVENTION

Accordingly, an object of the present invention is to provide a loading mechanism having proportional distributing arrangement.

According to one aspect of the present invention, there is provided a loading mechanism, which includes a loading plate, a proportional distributing plate disposed under the loading plate and defining a frame structure. The proportional distributing plate includes engaging tabs at corners thereof and four sides each having an abutting section located at a lower level than the engaging tab. The loading plate depresses the tabs of the distributing plate which subsequently transfer the load applied on the tabs to the abutting sections of the sides.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
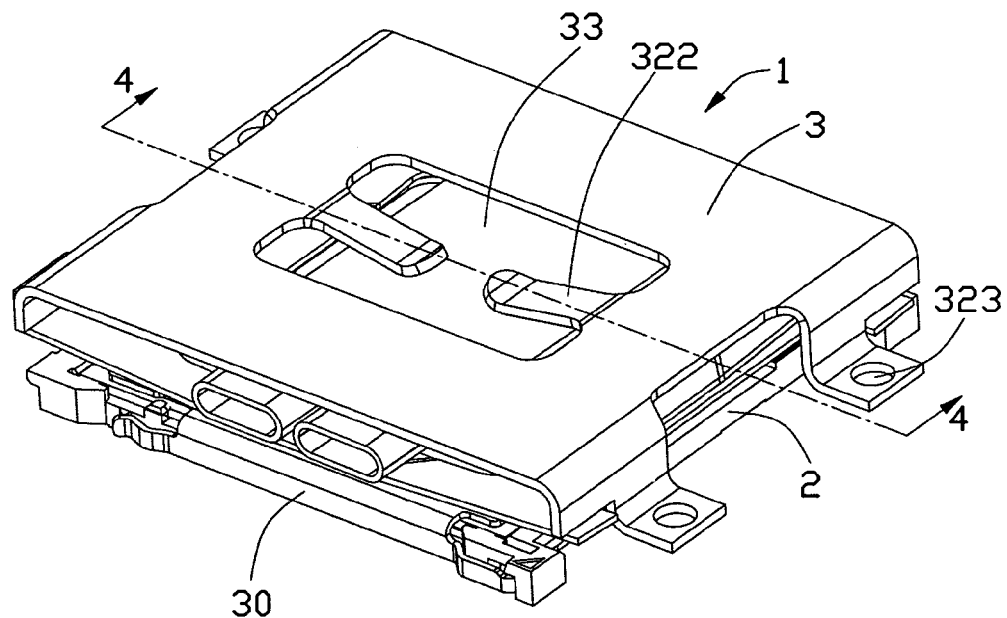
FIG. 1 is an assembled, perspective view of a socket assembly in accordance with a preferred embodiment of the present invention.
Figure 2:
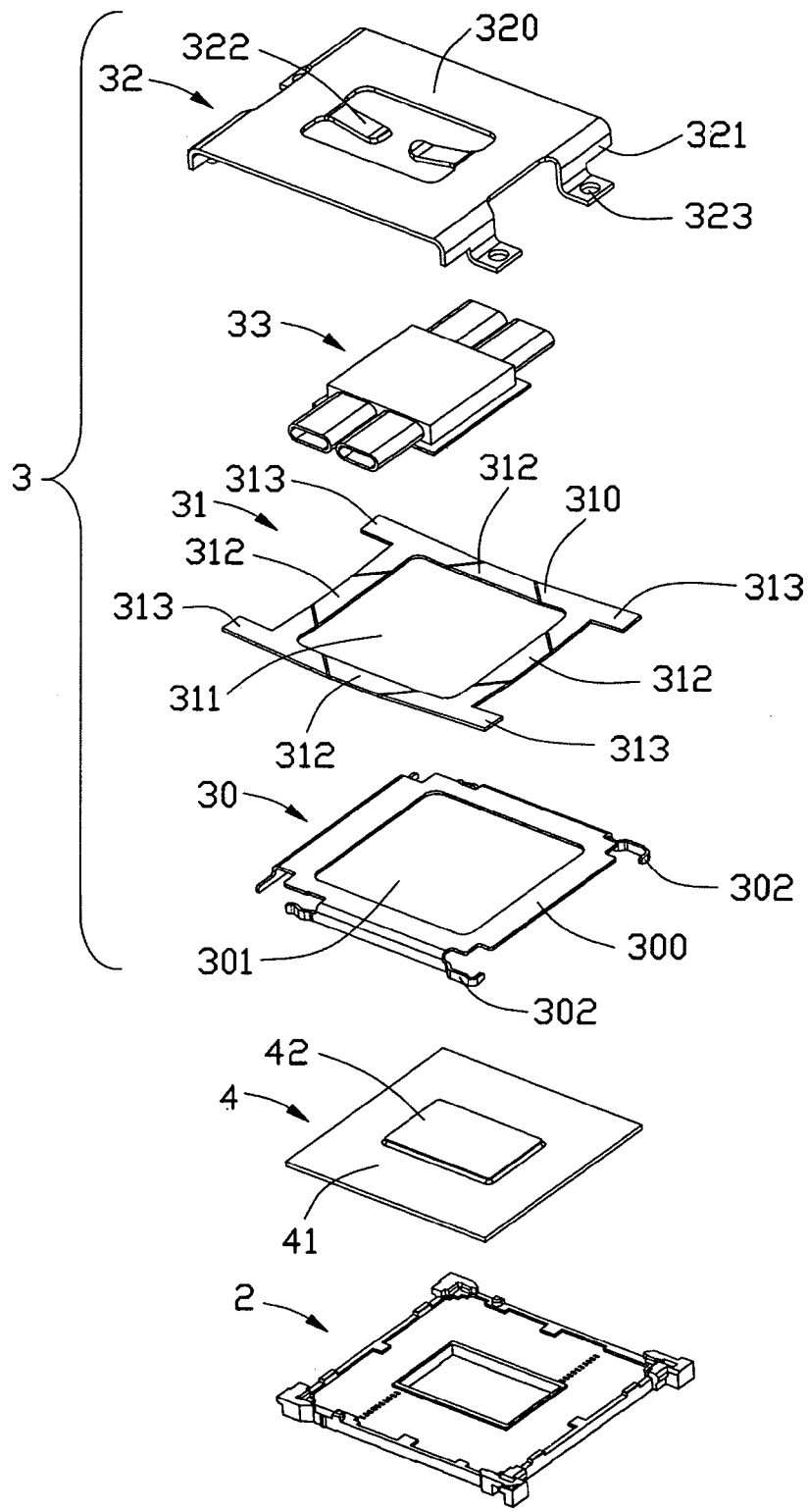
FIG. 2 is an exploded, perspective view of the socket assembly shown in FIG. 1.
Figure 3:
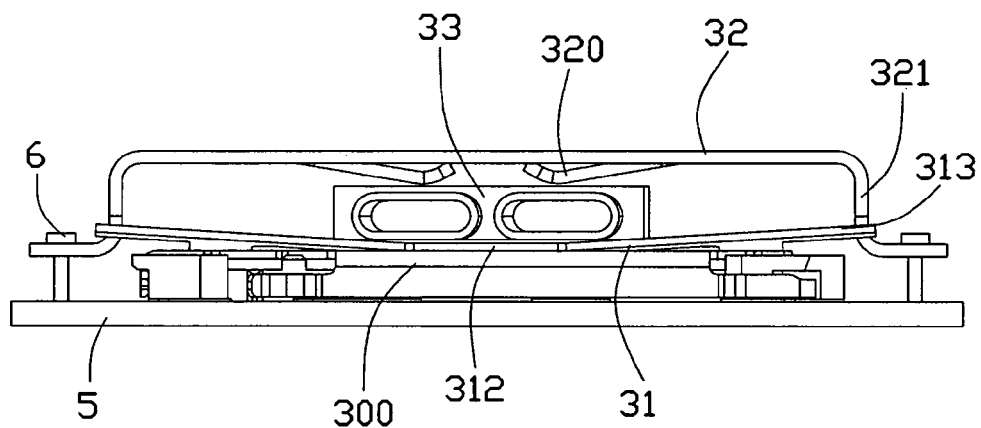
FIG. 3 is a side view of the socket assembly shown in FIG. 1 and a mother board.

Referring to FIGS. 1-3, a loading assembly 3 made in accordance with the present invention cooperates with a socket 2 and jointly constitute a socket assembly 1 to receive an IC package 4. The socket 2 has a mating port with a plurality of contacts (not shown) therein for engaging with the IC package 4 such that an electrical connection is achieved between the IC package 4 and a mother board 5 on which the socket assembly 1 is mounted.

Particularly referring to FIG. 2, the loading mechanism 3 includes a retention plate 30, a proportional distributing plate 31, and an loading plate 32. The retention plate 30 is pivotably mounted to one end of the socket 2, and is able to be turned between a closed position where it covers the socket in a horizontal position and an open position where it is angular to the socket 2 allowing the IC package 4 to be placed upon the socket 2. The retention plate 30 has a frame structure, including four edges 300 with an opening 301 defined therebetween. A pair of clasps 302 are provided at opposite sides of one edge 300 to be engaged with the socket 2 such that the retention plate 30 is pivotably assembled to the socket 2.

The IC package 4 has a substrate 41 and a die 42 on a center position of the substrate 41. When the IC package 4 is seated upon the socket 2 and the retention plate 30 is turned to the closed position, the four edges 300 cover the periphery area of the substrate 41, with the die 42 exposed outside via the opening 42. Thus, the IC package 4 is prepositioned upon the socket 2 by the retention plate 30.

The proportional distributing plate 31 is placed upon the retention plate 30 and also has a frame structure including four sides 310 defining a center opening 311 therebetween corresponding to the opening 301 of the retention plate 30. Abutting sections 312 are provided at middle positions of the sides 310 and are depressed downwardly such that the abutting sections 312 are able to abut against the edges 300 of retention plate 30. The ends of the sides 310 are lifted up away from the retention plate 30. Each corner of the proportional distributing plate 31 is provided with an engaging tab 313 located at a high level than the abutting section 312 for engaging with the loading plate 32.

The loading plate 32 is located upon and engaged with the proportional distributing plate 31. The loading plate 32 includes a primary plate 320 and four pressing portions 321 extending downwardly from four corners of the primary plate 321. Each pressing portion 321 is further extended with a fastening hole 323. A heat sink 33 is sandwiched between the loading plate 32 and the proportional distributing plate 31. The loading plate 32 is further formed with a pair of spring fingers 322 which press a top surface of the heat sink 33.

Figure 4:
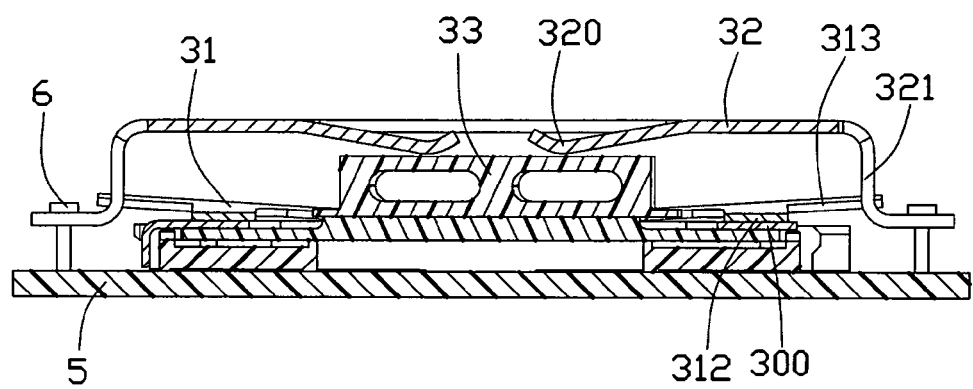
FIG. 4 is a cross-sectional view of socket assembly and a mother board, taken along the line 4-4 labeled in FIG. 1.
Figure 5:
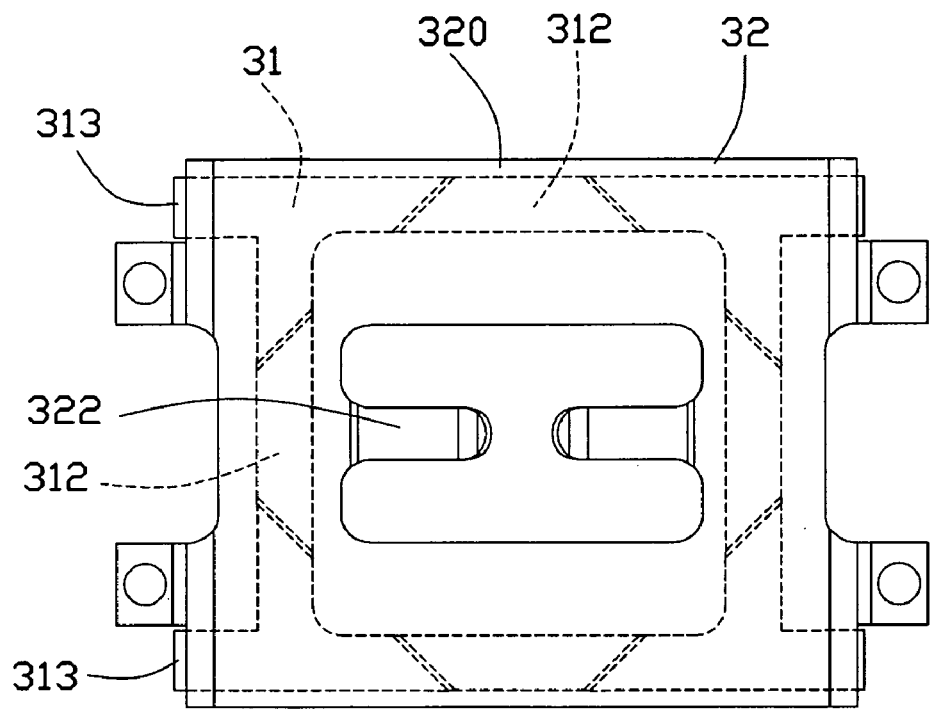
FIG. 5 is a top view showing a loading plate depressing a proportional distributing plate in accordance with a preferred embodiment of the present invention.

Also referring to FIGS. 3-5, the loading plate 32 is directly fastened to a mother board 5 by screws 6. The pressing portions 321 press the engaging tabs 313 of the proportional distributing plate 31 which is consequently deformed and transfers the load from the corners thereof to the abutting sections 312. The four abutting sections 312 press four edges 300 of the retention plate 30 respectively and simultaneously, thereby applying relative even loading force to the substrate 41 of the IC package 4.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A loading mechanism, comprising:
   a loading plate;
   a proportional distributing plate disposed under the loading plate and defining a frame structure, the proportional distributing plate comprising engaging tabs at corners thereof and four sides each having an abutting section located at a lower level than the engaging tab;
   a retention plate for cooperating with a socket to preposition an IC package, the abutting section abutting against periphery areas of the retention plate;
   wherein the loading plate depresses the engaging tabs of the proportional distributing plate which subsequently transfer the load applied on the engaging tabs to the abutting sections of the sides.

2. The loading mechanism as claimed in claim 1, wherein the loading plate comprises a plurality of pressing portions extending downwardly therefrom for engaging with the engaging tabs.

3. The loading mechanism as claimed in claim 1, wherein the loading plate is formed with a plurality of fastening holes engaged with screws so as to fasten the loading plate to a mother board.

4. The loading mechanism as claimed in claim 1, further comprising a heat sink sandwiched between the loading plate and the proportional distributing plate, the loading plate comprising a spring finger for pressing the heat sink.

5. The loading mechanism as claimed in claim 1, wherein the retention plate is pivotably mounted to one end of the socket by a pair of clasps thereof.

6. The loading mechanism as claimed in claim 1, wherein the retention plate and the proportional distributing plate respectively have openings corresponding to each other so as to allow a die of the IC package to contact with a heat sink.

7. A socket assembly, comprising:
   a socket with a mating port for mating with an IC package;
   a retention plate pivotably mounted to one end of the socket assembly for prepositioning the IC package upon the socket;
   a proportional distributing plate located upon and having multiple contacting points capable of abutting against the retention plate; and
   a loading plate located upon the proportional distributing plate and fastened to a mother board, the loading plate depressing the proportional distributing plate, thereby providing a relative even loading force to the IC package.

8. The socket assembly as claimed in claim 7, wherein the proportional distributing plate comprises four sides each having an abutting section depressed downwardly and pressing the retention plate while ends of the sides are lifted up away from the retention plate.

9. The socket assembly as claimed in claim 7, wherein the proportional distributing plate is provided with a plurality of engaging tabs at corners thereof, and the loading plate comprising a plurality of pressing portions engaged with the engaging tabs.

10. The socket assembly as claimed in claim 7, wherein the loading plate is formed with a plurality of fastening holes engaged with screws so as to fasten the loading plate to the mother board.

11. The socket assembly as claimed in claim 7, further comprising a heat sink sandwiched between the loading plate and the proportional distributing plate, the loading plate comprising a spring finger for pressing the heat sink.

12. The socket assembly as claimed in claim 7, wherein the retention plate is pivotably mounted to one end of the socket by a pair of clasps.

13. The socket assembly as claimed in claim 7, wherein the retention plate and the proportional distributing plate respectively have openings corresponding to each other so as to allow a die of the IC package to contact with a heat sink.

14. A socket assembly comprising:
    a PCB (printed circuit board);
    an electrical connector mounted upon the PCB; an electronic package loaded unto the electrical connector;
    a retention plate seated upon the electronic package to downwardly urge the electronic package toward the electrical connector for electrical connection between the electrical connector and the electronic package, a first center opening formed in the retention plate;
    a distributing device seated upon the retention plate;
    a heat dissipation device including a heat pipe associated with a heat sink which is directly seated upon a die of the electronic package via said first center opening; and
    a loading plate secured to the PCB and defining a first pressing section downwardly pressing the heat sink to enhancement of thermal connection between the heat sink and the electronic package, and a second pressing section downwardly pressing the distributing device so as to have said distributing device downwardly press the retention plate for enhancement of said electrical connection between the electrical connector and the electronic package.

15. The socket assembly as claimed in claim 14, wherein said distributing device is of a plate having a second center opening which is essentially vertically in alignment with the first center opening and via which the heat sink contacts the die of the electronic package.

16. The socket assembly as claimed in claim 15, wherein said distributing plate is more deflectable than both the retention plate and the loading plate.

17. The socket assembly as claimed in claim 15, wherein said loading plate defines a third center opening essentially vertically in alignment with the first center opening and the second center opening, and at least one finger extending from an edge of the third center opening to downwardly urge the heat sink.

18. The socket assembly as claimed in claim 14, wherein the retention plate is directly mounted to a periphery portion of the electrical connector.

19. The socket assembly as claimed in claim 18, wherein said retention plate is pivotally mounted to the periphery portion of the electrical connector.

* * * * *